United States Patent [19]
Sugasawara et al.

[11] Patent Number: 6,102,962
[45] Date of Patent: *Aug. 15, 2000

[54] METHOD FOR ESTIMATING QUIESCENT CURRENT IN INTEGRATED CIRCUITS

[75] Inventors: Emery O. Sugasawara, Pleasanton; Stefan Graef, Milpitas, both of Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/924,277

[22] Filed: Sep. 5, 1997

[51] Int. Cl.[7] .................................................. G06F 17/50
[52] U.S. Cl. .................................. 716/5; 716/11
[58] Field of Search ..................... 364/488, 489, 364/490, 491; 716/5, 11

[56] References Cited

U.S. PATENT DOCUMENTS

| | | | |
|---|---|---|---|
| 4,737,732 | 4/1988 | Westwick | 330/261 |
| 5,025,344 | 6/1991 | Maly et al. | 361/88 |
| 5,392,293 | 2/1995 | Hsue | 364/481 |
| 5,530,612 | 6/1996 | Maloney | 361/56 |
| 5,532,174 | 7/1996 | Corrigan | 437/8 |
| 5,610,832 | 3/1997 | Wikle et al. | 364/491 |
| 5,644,251 | 7/1997 | Colwell et al. | 326/16 |
| 5,670,890 | 9/1997 | Colwell et al. | 324/765 |
| 5,856,749 | 1/1999 | Wu | 327/66 |
| 5,889,408 | 3/1999 | Miller | 324/765 |

OTHER PUBLICATIONS

Ferre et al "On Estimating Bounds of the Quiescent Current for IDDQ Testing," IEEE, Apr. 1996, pp. 106–111.

Vargas et al "Quiescent Current Estimation Based on Quality Requirements," IEEE, 1993, pp. 33–39.

Champac et al "Analysis of Teh Floating Gate Defect in COMOS," IEEE, Oct. 1993, pp. 101–108.

Manhaeve et al "An Off–Chip IDDQ Current Measurement Unit for Telecommunication ASICs," IEEE, 1994, pp. 203–212.

Chen et al "Gate–to–Channel Shorts in BiCMOS Logic Gates," IEEE, Apr. 1994, pp. 440–445.

IBM Microelectronics, Defect Localization—Fault Isolation, at http://www.chips.ibm.com/services/asg/capabilities/asweb07.html, 10 pages, (No date).

IBM Microelectronics, Enhance VLSI functional failure analysis with IDDQ current measurements, at http://www-.chips.ibm.com/services/asg/appnotes/app01.html, 3 pages, (No date).

*Primary Examiner*—Paul R. Lintz
*Assistant Examiner*—Vuthe Siek
*Attorney, Agent, or Firm*—Akin, Gump, Strauss, Hauer & Feld, LLP

[57] ABSTRACT

A method for improving the accuracy of quiescent current estimation for integrated circuits. When used with a CMOS process, the method involves selecting transistors having a polysilicon gate length corresponding to the minimum length permitted by process design rules. For each of the selected transistors, the intersection of the width of the polysilicon gate and the active area of the transistor is calculated. The widths of all of the selected minimum length devices are summed to generate a total width dimension value. The total width dimension value is multiplied by a predetermined quiescent current per unit width conversion value to produce an estimate of the quiescent current drawn by the integrated circuit. In an alternate embodiment of the invention, the total width dimension value is multiplied by a range of predetermined quiescent/leakage current per unit width values representing a range of testing conditions and temperatures. The method of the invention can be implemented as a stand-alone software routine or integrated within a design verification or test pattern generation tool. The accuracy of quiescent current estimation provided by the invention permits realistic test values to be established, thereby enhancing both quality and yield of semiconductor processes.

20 Claims, 4 Drawing Sheets

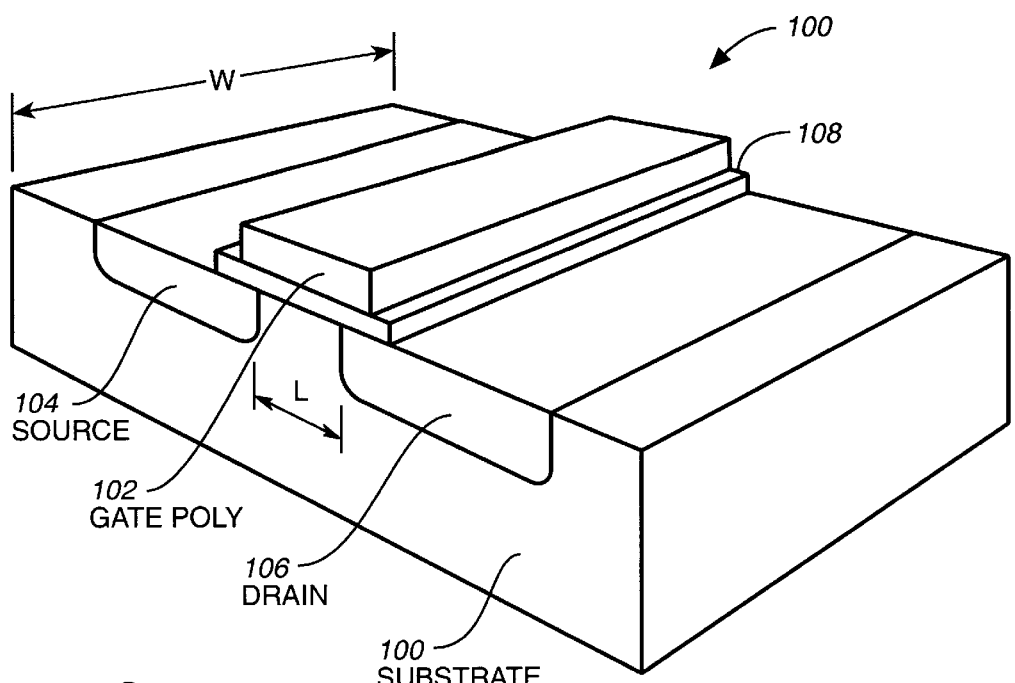
FIG._1A
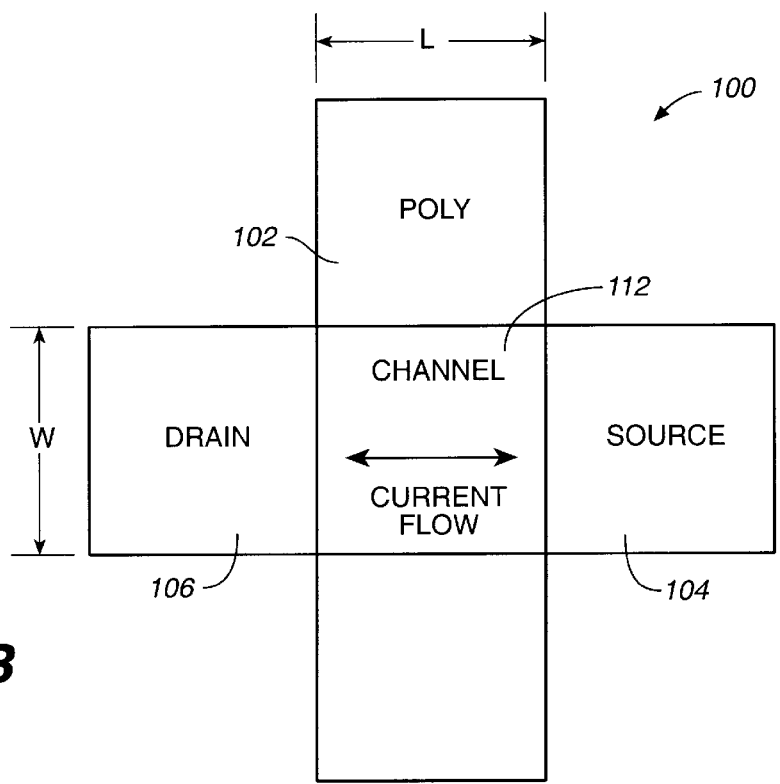
FIG._1B

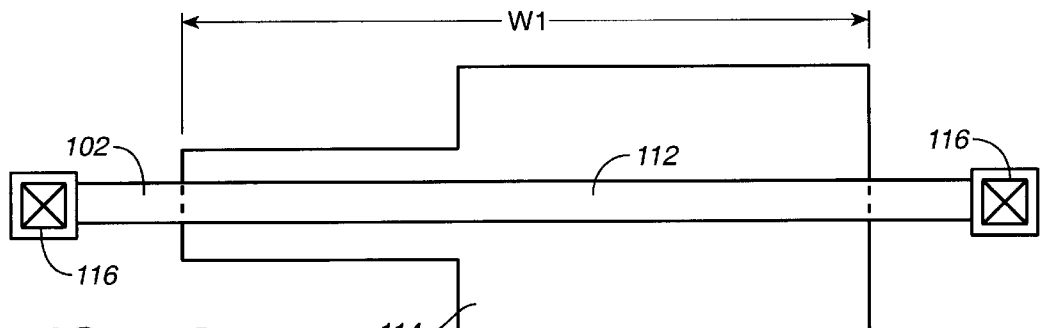
FIG._2A
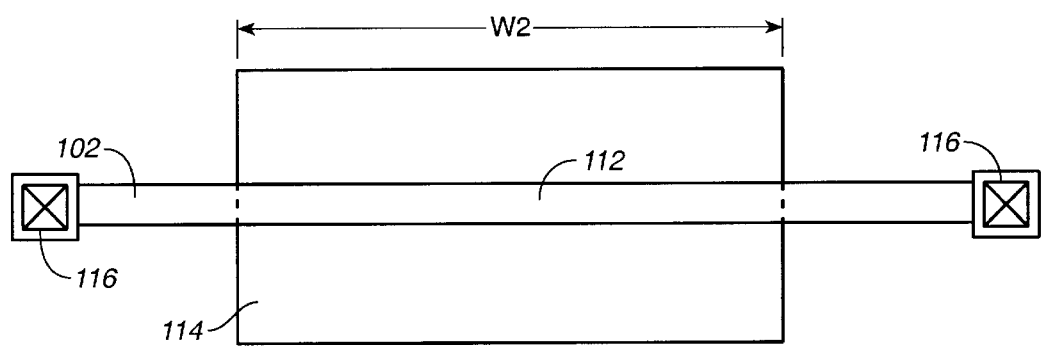
FIG._2B
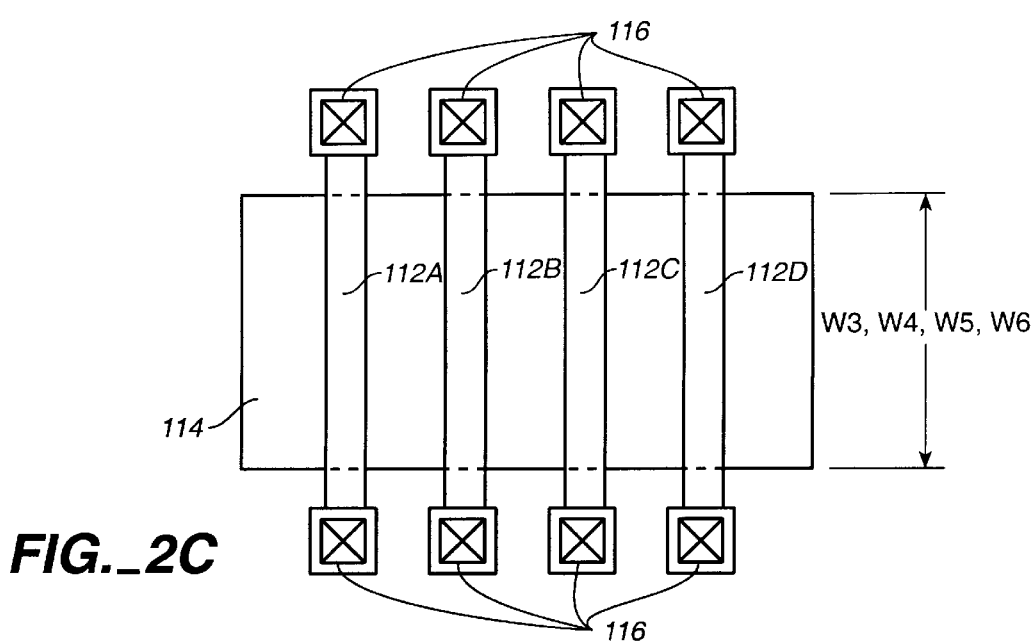
FIG._2C

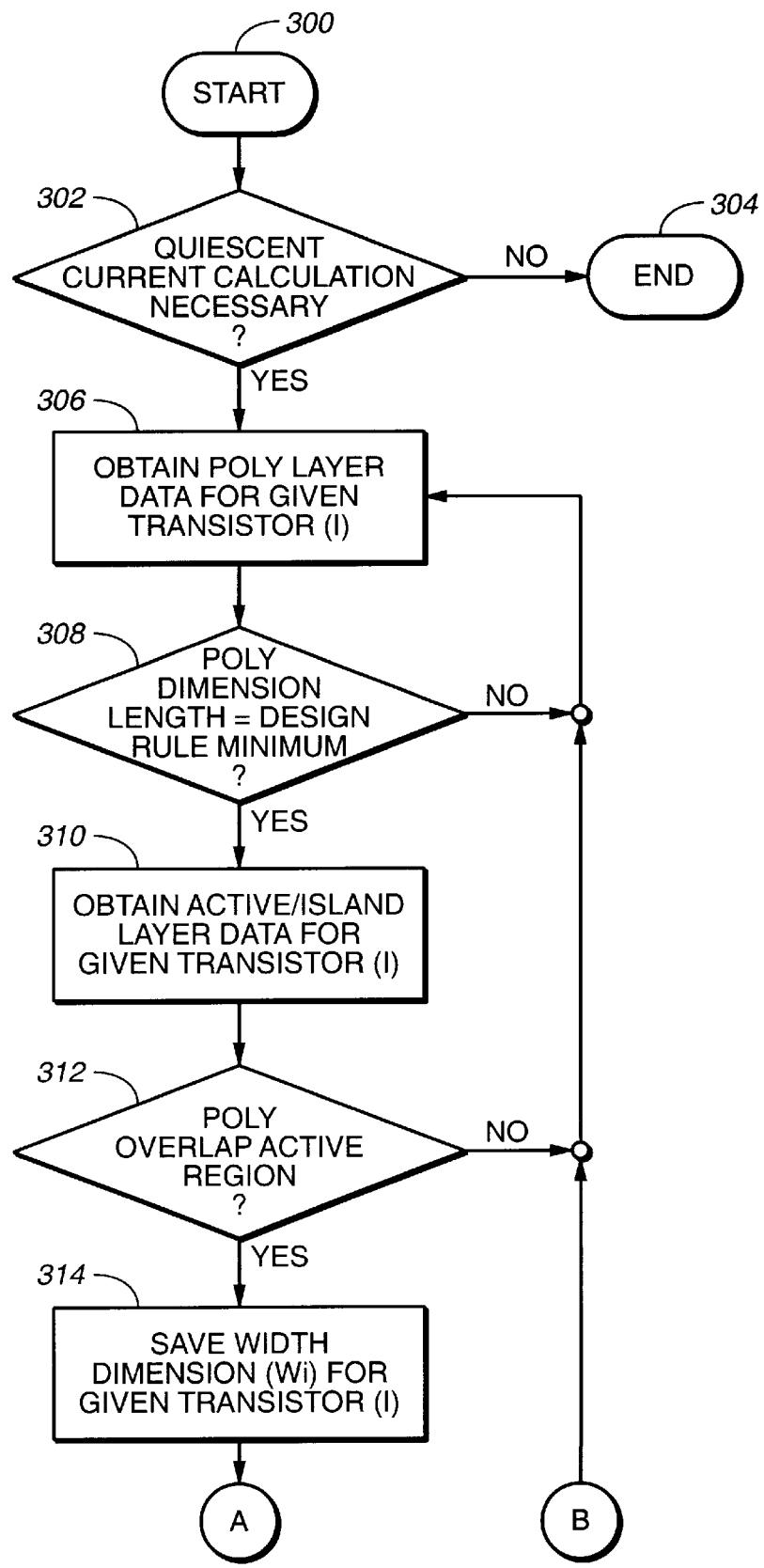
FIG._3A

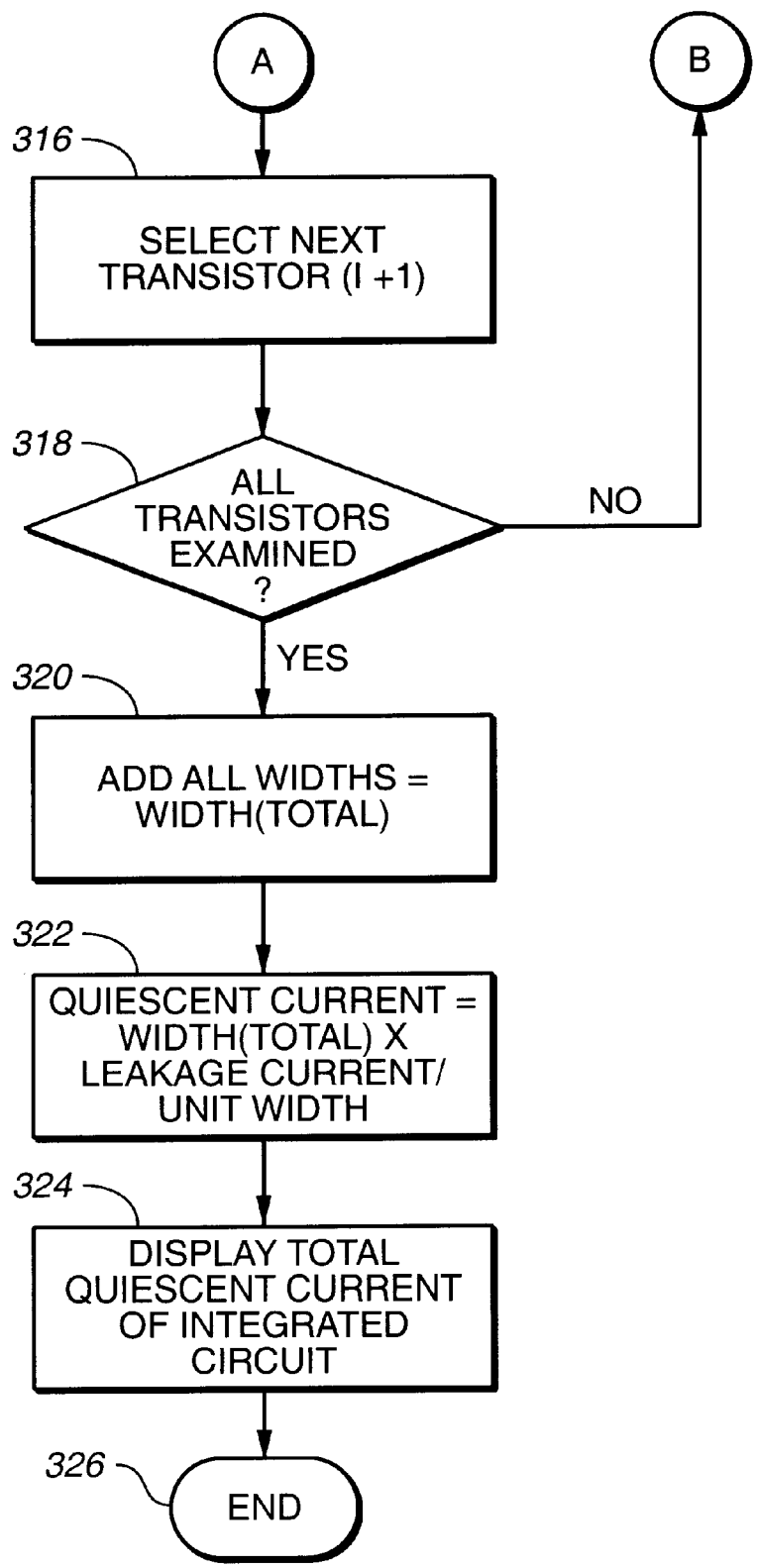
FIG._3B

METHOD FOR ESTIMATING QUIESCENT CURRENT IN INTEGRATED CIRCUITS

BACKGROUND OF THE INVENTION

1. Field of the Invention

The invention relates to testing of semiconductor devices, and more particularly to an improved method for estimating overall quiescent currents in integrated circuits to facilitate the establishment of realistic test limits.

2. Description of the Related Art

Integrated circuits have become essential components of many consumer and commercial electronic product produced today, often replacing discrete components and enhancing functionality. The semiconductor processing technologies that produce these integrated circuits have advanced to the point where complete systems can often be reduced to a single integrated circuit. The evolution of the integrated circuit has not been uncomplicated, however. Continually shrinking device geometries, coupled with the high cost of operating semiconductor processing equipment, result in increased demands on integrated circuit suppliers to improve process yields and develop new test strategies.

Currently, complementary metal-oxide-semiconductor (CMOS) is the most popular technology for fabricating integrated circuits (ICs) due to its inherent low power consumption in high densities. CMOS circuits use complementary p-channel metal-oxide-semiconductor field-effect (PMOS) transistors and n-channel metal-oxide-semiconductor field-effect (NMOS) transistors to produce fully static designs that ideally consume no power except when switching states. In practice, however, CMOS circuits draw low leakage currents (also referred to as quiescent power supply current or IDDQ) in a static state. Quiescent current testing therefore provides a relatively simple and cost-effective test strategy for screening for physical defects.

The main goal of semiconductor test strategies is to screen out devices having functional or physical defects, while establishing test limits that do not reject good devices. Many test development strategies have evolved, and often combinations of these strategies are utilized to provide a high degree of fault coverage. Test development strategies include functional test wherein automatic test equipment (ATE) test programs are performed in which the circuit under test is stimulated with specified inputs while the outputs are monitored to determine if they correspond with simulated logic values. Structural tests are also utilized and rely on a model of logical circuit faults. These tests are often implemented using "boundary scan" or "full scan" circuitry in conjunction with structural test sets. Structural tests sometimes begin with functional logic simulations that have been fault graded and enhanced for higher fault coverage.

Another test development strategy, physical defect testing, involves creating specific tests designed to detect possible real physical defects that can occur in a circuit. Physical testing is useful for detecting defects that may not cause the device to fail functional or structural testing, but may lead to failure in the field. Defects in integrated circuits take many forms, some of which are test pattern sensitive. Gate oxide defects, drain to source current leaks (punch-through), and p-n junction current leaks (such as drain or source to diffusion current leaks) tend to be pattern sensitive, while resistive shorts to ground or the power supply voltage are usually pattern insensitive. In either case, quiescent current tests are a valuable tool in detecting faults.

Generally, the result of test development is an ATE test program or test "set" providing stimulus/response test "vectors" in the language of the ATE. The ATE test set causes the inputs of the device under test to be driven in a predetermined manner, while output pin voltages are compared to stored test values. The ATE test set is derived mainly from functional and structural test development logic simulations.

When testing quiescent current with a functional test set, the tester is generally halted at predetermined test steps suitable for quiescent current testing. Once halted (i.e., no switching is occurring) the power supply of the device under test is measured by the ATE and the resulting value is compared to predetermined reference values or test limits. Such quiescent current tests are effective in detecting many faults that would otherwise not be found by other test strategies.

For example, with most functional tests that measure voltage, faults must propagate to the output pins of the device under test for the ATE to differentiate between a good or bad device. Quiescent current tests differ in that current is sensed rather than voltage, providing a simple means to monitor the entire circuit or portions thereof for overcurrent conditions. The quiescent current measurements are typically accomplished via the tester's parametric unit.

Accurate quiescent current testing requires that the device under test be in a static DC condition, with any circuitry that draws current in the static DC condition being disabled or accounted for in the test limits. Preferably analog circuitry, input/output pads, and other circuitry not conducive to quiescent current testing are provided with separate, dedicated power supply inputs, so that digital core circuitry can be tested separately.

Quiescent current varies with both the size of the integrated circuit as well as the minimum transistor channel length. Quiescent current dissipation is highest in transistors having a gate length that is at the minimum allowed by the process design rules. Such transistors account for the majority of transistors in a typical integrated circuit. Further, power supply voltages are continually being reduced in an effort to minimize power dissipation. However, reduced power supply voltages generally result in lower threshold voltages for transistors for a given fabrication process. Consequently, quiescent current increases as power supply voltages are lowered. These variations in quiescent current are not always adequately accounted for by existing estimation methods.

Quiescent current testing is currently performed by many semiconductor manufacturers, but no standardized method exists for selecting the quiescent current reference values or limits that determine whether a device passes or fails the test. Test limits are often quite loose and sometimes established on an arbitrary basis. One method involves simply estimating the number of transistors in a device and multiplying by a conversion factor. In another method, representative devices are sampled to arrive at an acceptable threshold. All of these prior methods for establishing quiescent current test limits suffer from inherent inaccuracies. If the quiescent current test limits are set too low, good devices may be rejected. If the quiescent current test limits are set too high, faulty devices may escape detection. In addition, a concern in establishing realistic quiescent current test limits is that high precision measurement of quiescent current requires a relatively long period of time. Thus, only a limited number of quiescent current test vectors are usually allowed. Currently, no satisfactory method exists for establishing quiescent current test limits.

SUMMARY OF THE INVENTION

Briefly, the present invention provides an improved method for estimating quiescent current in integrated circuits. Transistors having a minimum length polysilicon gate allowed by process design rules are selected from a polygon representation of the integrated circuit, such as a GDSII or similar database format representing the integrated circuit layout structure. For each of the selected transistors, the intersection of the width of the polysilicon gate and the active area of the transistor is calculated. In the preferred embodiment, the widths of all of the selected minimum length devices are summed to generate a total width dimension value. The total width dimension value is then multiplied by a predetermined quiescent current per unit width conversion value to produce an estimate of the quiescent current drawn by the integrated circuit. Alternatively, the total width dimension value can be multiplied by a range of predetermined quiescent/leakage current per unit width values representing a range of testing conditions and temperatures, or separate values can be used for different types of transistors or process variations.

A quiescent current estimation method according to the present invention is capable of being utilized with any type of semiconductor device, particularly when the device can be placed in a low current state during testing. The method can be implemented as a stand-alone software routine or integrated within a design verification or test pattern generation tool. The accuracy of quiescent current estimation provided by the present invention permits realistic test values to be established, thereby enhancing both quality and yield.

BRIEF DESCRIPTION OF THE DRAWINGS

A better understanding of the present invention can be obtained when the following detailed description of the preferred embodiment is considered in conjunction with the following drawings, in which:

FIG. 1A is cross-sectional view of a typical metal-oxide-semiconductor integrated transistor;

FIG. 1B is a top view of the polysilicon, channel and diffused regions of the transistor of FIG. 1 A;

FIGS. 2A, 2B, and 2C are layout layer representations of the polysilicon and active regions of exemplary minimum length transistors examined to produce an estimate of quiescent current in a method according to the present invention; and FIGS. 3A and 3B are flow diagram representations of a method according to the present invention for estimating quiescent current in an integrated circuit.

DETAILED DESCRIPTION OF THE PREFERRED EMBODIMENT

Turning now to the drawings, FIG. 1A shows a cross-sectional view of a generic metal-oxide-semiconductor (MOS) integrated transistor 100. In a typical integrated circuit, hundreds of thousands or even millions of such transistors are connected to form digital circuitry. An integrated transistor 100 is typically built on the surface of a silicon substrate 110 by interconnecting sections of materials in three primary layers: a conducting layer of metal (not shown) used for electrical connection; and two layers of semiconductors—polysilicon or poly 102 and diffusion regions (shown as source diffusion region 104 and drain diffusion region 106). The semiconductor layers are normally isolated from each other by insulating material such as silicon dioxide (or gate oxide) 108. The diffusion regions 104 and 106 can be of n-type, meaning that electrons carrying a negative charge are available to support electrical conduction in a voltage gradient, or of p-type, if holes carrying positive charges are used to support electrical conduction. To enhance the availability of charge carriers, the semiconductors can be implanted with additional charge carrying ions. When a polysilicon layer 102 overlays (on two opposing sides) two diffusion regions 104 and 106, an enhancement-mode transistor is formed. If the silicon surface underneath the polysilicon layer 102 is implanted, a depletion-mode transistor is formed.

There are two basic types of MOS transistors: the n-channel and p-channel. In an n-channel MOS (NMOS) transistor, two n-type diffusions regions 104 and 106 are embedded in a p-type substrate 110 and connected via metal or other conducting material to form the source and drain of the transistor 100. On the surface of the substrate 110, the thin layer of silicon dioxide material 108 is formed. The polysilicon layer 102 is then deposited on top of the silicon dioxide material 108 to form the gate of the transistor 100. Alternatively, if the substrate 110 is n-type and the diffusion regions 104 and 106 are p-type, a p-channel MOS (PMOS) transistor is formed. In addition to a CMOS process, it is contemplated that the present invention could be utilized with any other type of semiconductor process, such as gallium arsenide or bipolar processes. When used with other processes, the specific materials for which polygon data is extracted may need to be substituted for those of the disclosed embodiment of the invention.

Referring now to FIG. 1B, a simplified top view of the polysilicon layer 102, channel region 112 and diffusion regions 104 and 106 of the transistor 100 is shown. The channel region 112 is defined to be the region under the polysilicon layer 102 between the source diffusion region 104 and drain diffusion region 106. During normal operation, current flow through the transistor 100 is between the drain diffusion region 106 and source diffusion region 104. The magnitude of the current is determined by the voltage differential between the drain diffusion region 106 and the source diffusion region 104 as well as the voltage differential between the gate/polysilicon layer 102 and source diffusion region 104 of the transistor 100, which generally must exceed a minimum value called the threshold voltage. Electrical operation of the transistor 100 is well known to those skilled in the art. In FIGS. 1A and 1B, L and W denote the length and width, respectively, of the portion of the polysilicon layer 102 overlapping the channel region 112.

During the design of an integrated circuit, a graphical layout layer is created that serves to interface the physical and electrical domains, creating a link between the integrated circuit and the fabrication process. At the layout level, the design issue of primary concern is optimizing the area of the layout subject to a set of design rules that permit overlapping and extension of the various structures such that the integrated circuit implemented by the fabrication process will function under conservative assumptions of process variations and the resolution of typical lithographic process steps. The minimum size of the transistor 100 is extremely process dependent and is subject to variation with the progress of technology.

Following graphical layout, a conversion program is used to port the layout layer database to a database in Calma GDSII or similar format. The GDSII database format is essentially a polygon representation of the layers of the integrated circuit layout, and is used by the commercial IC industry to generate the physical masks used in the fabrication of the integrated circuit. One or more masks correspond, on a wafer level, to each of the separate layers of materials used to build integrated circuit components such as transistors. It is possible to extract information regarding the dimensions of specific semiconductor devices from a GDSII or similar database format.

Referring now to FIGS. 2A, 2B and 2C, layout layer representations of the polysilicon layer 102 and active regions 114 of exemplary minimum length transistors are shown. All channel regions 112 shown in FIGS. 2A–2C are assumed to be formed of minimum length polysilicon for purposes of the present discussion, although a method according to the present invention can be utilized to estimate the quiescent currents for transistors having any gate length.

Referring more specifically to FIGS. 2A and 2B, channel regions 112 of widths W1 and W2 are defined by the overlap of a polysilicon layer 102 and an active region 114. In a typical CMOS process, the active region 114 defines the extent of the diffusion regions 104 and 106 used to form the source and drain, respectively, of a transistor. A comparison of FIGS. 2A and 2B illustrates that an active region 114 can take many shapes. Variations in shape generally have little effect on the anticipated quiescent current of a transistor. It should be noted that the particular size and shape of the active region 114 is not considered critical to the invention. Metal-polysilicon contact cuts 116 in the insulating layer between the polysilicon layer 102 and a signal line (not shown), normally composed of a metal material, allow gate voltages to be applied to the transistor. As described below in conjunction with FIGS. 3A and 3B, the widths of the channel regions 112 of minimum gate length transistors (which account for the majority of quiescent current dissipation in a typical digital integrated circuit) are examined and utilized in the estimation of quiescent current according to the preferred embodiment of the present invention.

As known to those skilled in the art, a single active region 114 can also be shared by a plurality of transistors, as shown in FIG. 2C. In a method according to the present invention, the widths W3, W4, W5, and W6 of the channel regions 112A, 112B, 112C and 112D, respectively, are all examined individually and utilized in the estimation of total quiescent current.

Referring now to FIGS. 3A and 3B, a flow chart diagram of a preferred method according to the present invention for calculating total quiescent current of an integrated circuit is shown. The process can be implemented as a stand-alone software routine or, alternatively, integrated within a design verification or test pattern generation tool. Following commencement of the routine in step 300, control proceeds to step 302 where it is determined if a quiescent current calculation is necessary. If not, control proceeds to step 304 and the routine is terminated or a return is made to a main program. If a quiescent current calculation is necessary as determined in step 302, control proceeds to step 306 and polysilicon layer 102 data is extracted for a selected transistor (I). This data may be obtained via a polygon database representing the integrated circuit layout structure, such as a GDSII database.

Next, in step 308, the length dimension of the polysilicon layer data for the selected transistor is examined to determine if it is a minimum length device as set forth by the design rules for the particular process. If so, control proceeds to step 310 where active layer data is extracted for the given transistor (I). Control then proceeds to step 312 where it is determined if the polysilicon layer 102 overlaps the extracted active region 114. If not, the transistor (I) is not operational and control passes to step 306 (or, alternatively, step 316) for examination of the next transistor (I+1). If the polysilicon length dimension of transistor (I) exceeds the minimum design rules as determined in step 308, control also returns to step 306 (or step 316) and the next transistor (I+1) is examined. For a given design, the order in which transistors are examined is not considered critical to the invention.

If the polysilicon layer 102 overlaps the extracted active region 114 as determined in step 312, control proceeds to step 314 and the width dimension (W1) for the given transistor (I) is stored. Control next proceeds to step 316 (FIG. 3B) for selection of the next transistor (I+1). Control then passes to step 318 where it is determined if all the transistors in the relevant portions of the integrated circuit design have been examined. If not, control returns to step 306 and the extraction process for a transistor (I+1) is repeated. If all transistors have been examined as determined in step 318, control proceeds to step 320 where the width dimensions of the all the minimum length transistors are summed to generate a total width dimension value.

Control then proceeds to step 322 for a calculation of the total estimated quiescent current. In step 322, the total width dimension calculated in step 320 is multiplied by a predetermined quiescent/leakage current per unit width value. For a typical CMOS process, this value is on the order of 100 picoamps/micron, although this number is highly process dependent. Alternatively, the total width dimension value can be multiplied by a range of predetermined quiescent/leakage current per unit width values representing variations in quiescent current due to differing testing conditions, supply voltages and temperatures. Average quiescent/leakage current per unit width values can be determined during characterization of the process used to fabricate the integrated circuit under examination, and the value(s) used in step 322 should be set to account for normal variations in quiescent current such that only defective devices are rejected during testing.

Next, control proceeds to step 324 and the estimated quiescent current value(s) for the integrated circuit (or portions thereof) under examination is displayed on a graphical user interface. Alternatively, the estimated quiescent current value(s) can be communicated to test pattern generation software or utilized in computing the power consumption of an integrated circuit. Finally, control proceeds to step 326 and the routine is terminated or a return is made to a main program.

Preferably, digital and analog circuitry in a mixed-mode integrated circuit are powered by separate power supplies pins that can be isolated during testing. If analog circuitry is powered by the same power supply pin(s) as the circuitry under examination by the method of FIGS. 3A and 3B, any static current drawn by the analog circuity is preferably added to the estimated quiescent current value determined in step 322 in order to generate realistic test limits.

An exemplary calculation according to the procedure of FIGS. 3A and 3B is shown below. Only minimum length devices as set forth by the design rules for the particular fabrication process are examined in the following calculation:

Number of Total Transistors = 100
Number of Transistors at Minimum Gate Length = 50
Number of Minimum Gate Length Transistors at 5 um (Width) = 15
Number of Minimum Gate Length Transistors at 10 um = 25
Number of Minimum Gate Length Transistors at 20 um = 10

-continued

| |
|---|
| 10 pA/um of Leakage Current (as determined from device characterization data) |
| TOTAL QUIESCENT CURRENT: |
| 25 × 10 um × 10 pA/um = 2.50 nA |
| 15 × 5 um × 10 pA/um = 0.75 nA |
| 10 × 20 um × 10 pA/um = 2.00 nA |
| Total Quiescent Current = 5.25 nA |

This calculation is set forth for purposes of illustration. In most integrated circuits, the number of minimum length transistors will be substantially larger.

Thus, a method has been described for improving the accuracy of quiescent current estimation for integrated circuits. When used with a CMOS process, the method involves selecting transistors having a minimum length polysilicon gate. For each of the selected transistors, the intersection or overlap of the width of the polysilicon gate and the active area of the transistor is calculated. The widths of all of the selected minimum length devices are summed to generate a total width dimension value. The total width dimension value is then multiplied by a predetermined quiescent current per unit width conversion value to produce an estimate of the quiescent current drawn by the integrated circuit. In an alternate embodiment of the invention, the total width dimension value is multiplied by a range of predetermined quiescent/leakage current per unit width values representing a range of testing conditions and temperatures. Separate values can also be used for different types of transistors or process variations. The accuracy of quiescent current estimation provided by a method according to the invention permits realistic test values to be established, thereby enhancing both the quality and yield of a semiconductor process.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for estimating quiescent currents in an integrated circuit having a layout structure represented by a layout database, comprising the steps of:

extracting polysilicon layer data representing a polysilicon area, from the layout database, for a selected transistor of the integrated circuit;

extracting active region data representing an active region area, from the layout database, for the selected transistor of the integrated circuit;

determining the approximate length of the extracted polysilicon layer data and/or determining if the extracted polysilicon layer data corresponds to a minimum length allowed by applicable design rules;

determining if the polysilicon area overlaps the active region area, comprising an overlapping area and, if so;

storing a width dimension or a close approximation thereof for the overlapping area; and multiplying the stored width dimension by a predetermined value related to unit width to generate an estimated quiescent current value for the selected transistor.

2. The method of claim 1, further comprising: selecting another transistor of the integrated circuit for examination if the length of the extracted polysilicon layer data does not correspond to a minimum length allowed by applicable design rules.

3. The method of claim 1, wherein the layout database is a GDSII or similar database.

4. A method for estimating quiescent currents in an integrated circuit having a layout structure represented by a layout database, comprising:

extracting polysilicon layer data representing a polysilicon area, from the layout database, for a selected transistor of the integrated circuit;

extracting active region data representing an active region area, from the layout database, for the selected transistor of the integrated circuit;

determining if the polysilicon area overlaps the active region area, comprising an overlapping area and, if so;

storing a width dimension or a close approximation thereof for the overlapping area; and selecting another transistor of the integrated circuit for examination;

repeating the previous steps until a predetermined number of transistors in the integrated circuit or a predetermined portion of the integrated circuit has been examined;

determining a total value of the stored width dimensions; and multiplying the total value of the stored width dimensions by a predetermined quiescent current per unit width value to generate an estimated quiescent current value.

5. The method of claim 4, further comprising:

following the step of extracting polysilicon layer data, determining whether the extracted polysilicon layer data corresponds to a minimum length allowed by a set of design rules for a process used to fabricate the integrated circuit and, if not, selecting another transistor of the integrated circuit for examination.

6. The method of claim 4 wherein the layout database is a GDSII or similar database.

7. The method of claim 4, wherein the integrated circuit is fabricated with a complementary metal-oxide-semiconductor process, and wherein:

the step of determining the total value of the stored width dimensions comprises determining the total value of the stored width dimensions for n-channel transistors and p-channel transistors; and the step of multiplying the total of the stored width dimensions by a predetermined quiescent current per unit width value comprises multiplying the total value of the stored width dimensions for n-channel transistors and p-channel transistors by distinct predetermined quiescent current per unit width values.

8. The method of claim 4, wherein the integrated circuit includes analog circuitry having an estimated static current value, the method further comprising the step of summing the estimated static current of the analog circuitry and the estimated quiescent current value.

9. The method of claim 4, wherein the step of multiplying the total of the stored width dimensions by a predetermined quiescent current per unit width value comprises multiplying the total of the stored width dimensions by a range of predetermined quiescent current per unit width values to account for variations in the fabrication process and/or test conditions.

10. The method of claim 4, further comprising:

communicating the estimated quiescent current value to a test pattern generation tool for use in the generation of test patterns.

11. The method of claim 4, further comprising:
communicating the estimated quiescent current value to a design verification tool.

12. The method of claim 4, further comprising:
visually displaying the estimated quiescent current value.

13. A machine-readable storage medium containing instructions, which, when executed by a processor, directs the processor to perform:
extracting polysilicon layer data representing a polysilicon area, from a layout database, for a selected transistor of the integrated circuit;
extracting active region data representing an active region area, from the layout database, for the selected transistor of the integrated circuit;
determining if the polysilicon area overlaps the active region area, comprising an overlapping area and, if so;
storing a width dimension or a close approximation thereof for the overlapping area; and
multiplying the stored width dimension by a predetermined value related to unit width to generate an estimated quiescent current value for the selected transistor.

14. The machine-readable storage medium of claim 13, further containing an instruction directing a processor to perform:
selecting another transistor of the integrated circuit for examination if the length of the extracted polysilicon layer data does not correspond to a minimum length allowed by applicable design rules.

15. A machine-readable storage medium containing instructions, which, when executed by a processor, directs the processor to perform:
extracting polysilicon layer data representing a polysilicon area, from a layout database, for a selected transistor of the integrated circuit;
extracting active region data representing an active region area, from the layout database, for the selected transistor of the integrated circuit;
determining if the polysilicon area overlaps the active region area, comprising an overlapping area and, if so;
storing a width dimension or a close approximation thereof for the overlapping area; and
selecting another transistor of the integrated circuit for examination;
repeating the previous steps until a predetermined number of transistors in the integrated circuit or a predetermined portion of the integrated circuit has been examined;
determining a total value of the stored width dimensions; and
multiplying the total value of the stored width dimensions by a predetermined quiescent current per unit width value to generate an estimated quiescent current value.

16. The machine-readable storage medium of claim 15, further containing an instruction directing a processor to perform:
following the step of extracting polysilicon layer data, determining whether the extracted polysilicon layer data corresponds to a minimum length allowed by a set of design rules for a process used to fabricate the integrated circuit and, if not, selecting another transistor of the integrated circuit for examination.

17. The machine-readable storage medium of claim 15, wherein:
determining the total value of the stored width dimensions comprises determining the total value of the stored width dimensions for n-channel transistors and p-channel transistors; and
multiplying the total of the stored width dimensions by a predetermined quiescent current per unit width value comprises multiplying the total value of the stored width dimensions for n-channel transistors and p-channel transistors by distinct predetermined quiescent current per unit width values.

18. The machine-readable storage medium of claim 15, further containing an instruction directing a processor to perform:
summing the estimated static current of predetermined analog circuitry and the estimated quiescent current value.

19. The machine-readable storage medium of claim 15, wherein multiplying the total of the stored width dimensions by a predetermined quiescent current per unit width value comprises multiplying the total of the stored width dimensions by a range of predetermined quiescent current per unit width values to account for variations in the fabrication process and/or test conditions.

20. The machine-readable storage medium of claim 15, further containing an instruction directing a processor to perform:
visually displaying the estimated quiescent current value on a visual display.

* * * * *